United States Patent [19]

Fukushima et al.

[11] 4,146,842
[45] Mar. 27, 1979

[54] NOISE MUTING CIRCUIT IN FM RECEIVER

[75] Inventors: Isao Fukushima, Fujisawa; Isao Akitake; Yoshimi Iso, both of Toyokawa; Hiroshi Shirai, Katsuta; Norio Minami, Mito, all of Japan

[73] Assignee: Hitachi, Ltd., Japan

[21] Appl. No.: 804,284

[22] Filed: Jun. 7, 1977

[30] Foreign Application Priority Data

Jun. 9, 1976 [JP] Japan .................................. 51-66511

[51] Int. Cl.² .............................................. H04B 1/10
[52] U.S. Cl. .................................... 325/348; 325/456; 325/478
[58] Field of Search .............. 325/344, 348, 349, 377, 325/473, 478, 480, 482, 487, 456; 329/130, 134, 203, 204, 110, 131

[56] References Cited

U.S. PATENT DOCUMENTS

| | | | |
|---|---|---|---|
| 2,512,637 | 6/1950 | Frazier | 325/479 |
| 2,961,532 | 11/1960 | Rowley | 325/473 |
| 3,181,069 | 4/1965 | Loughlin | 325/478 |
| 3,534,268 | 10/1970 | Mazziota et al. | 325/348 |
| 3,699,457 | 10/1972 | Wright | 325/348 |
| 3,866,125 | 2/1975 | Kilian | 325/348 |

Primary Examiner—Robert L. Griffin
Assistant Examiner—Jin F. Ng
Attorney, Agent, or Firm—Craig & Antonelli

[57] ABSTRACT

In an FM receiver having an amplifier for amplifying an FM signal of intermediate frequency applied to an input terminal, and a phase multiplier type FM demodulator for demodulating the FM signal of intermediate frequency amplified by the amplifier, a noise muting circuit is disposed between the demodulator and the amplifier for muting noise transmitted from the amplifier to the demodulator when no FM signal input appears at the input terminal. This noise muting circuit comprises a pair of diodes connected in inverse-parallel with each other.

9 Claims, 8 Drawing Figures

NOISE MUTING CIRCUIT IN FM RECEIVER

FIELD OF THE INVENTION

This invention relates to an FM receiver employing a phase multiplier type FM demodulating circuit, and more particularly to a circuit for use in such an FM receiver for muting noise which appears when no FM input signal is received or when the level of an FM input signal is low.

BRIEF DESCRIPTION OF THE DRAWING

FIG. 6 is a signal waveform diagram illustrating the operation of the embodiment shown in FIG. 5.

DESCRIPTION OF THE PRIOR ART

Figure 1:
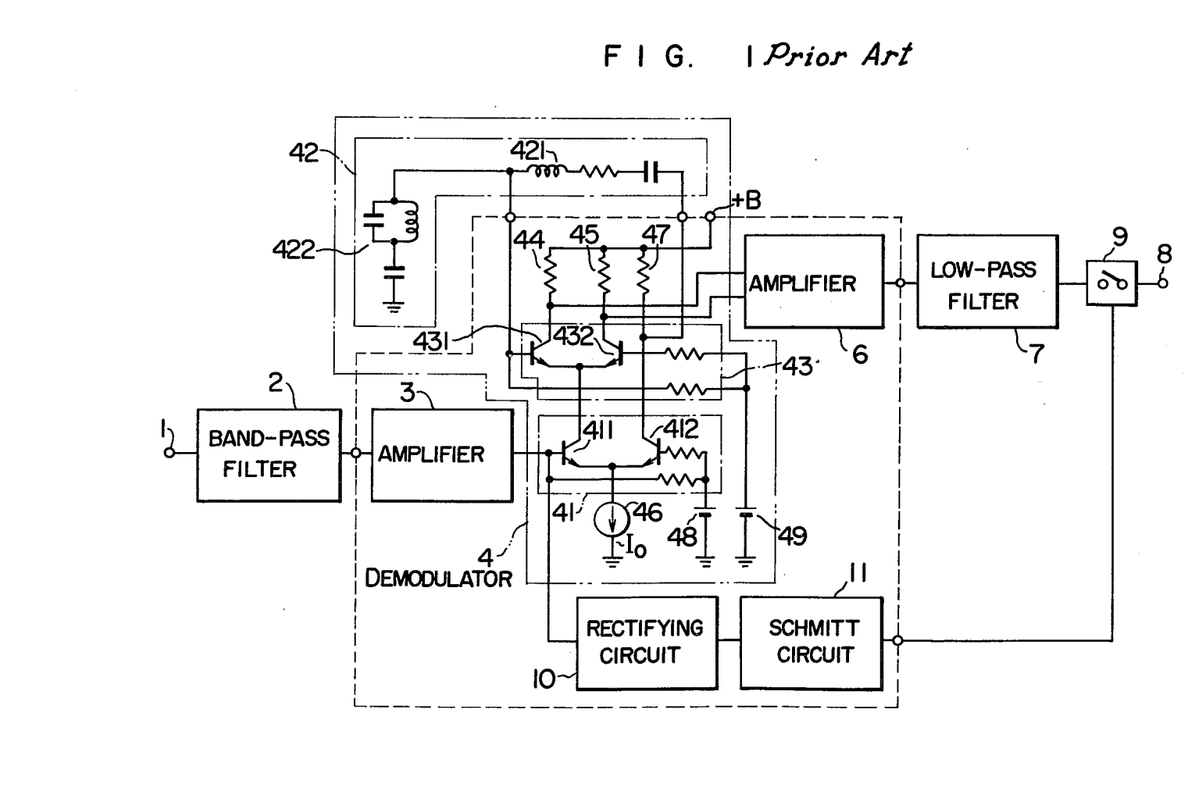
FIG. 1 is a connection diagram of a prior art phase multiplier type FM demodulating circuit and its peripheral circuits.

FIG. 1 is a connection diagram of a prior art phase multiplier type FM demodulating circuit and its peripheral circuits. The operating principle of the prior art design will be briefly described with reference to FIG. 1 so that the present invention can be more clearly understood.

Referring to FIG. 1, an FM signal of intermediate frequency is applied to an input terminal 1 and passes through a filter 2 and an amplifier 3 to be applied to a first switching circuit 41 in a demodulating circuit 4. The first switching circuit 41 includes a differentially operating transistor pair 411 and 412, and the signal applied to the first switching circuit 41 is applied to a phase shifting circuit 42 through the transistor 412 of the transistor pair 411 and 412. After being subjected to a phase shift by about $\pi/2$ (90°), the signal is applied from the phase shifting circuit 42 to a second switching circuit 43 including a differentially operating transistor pair 431 and 432.

Figure 2:
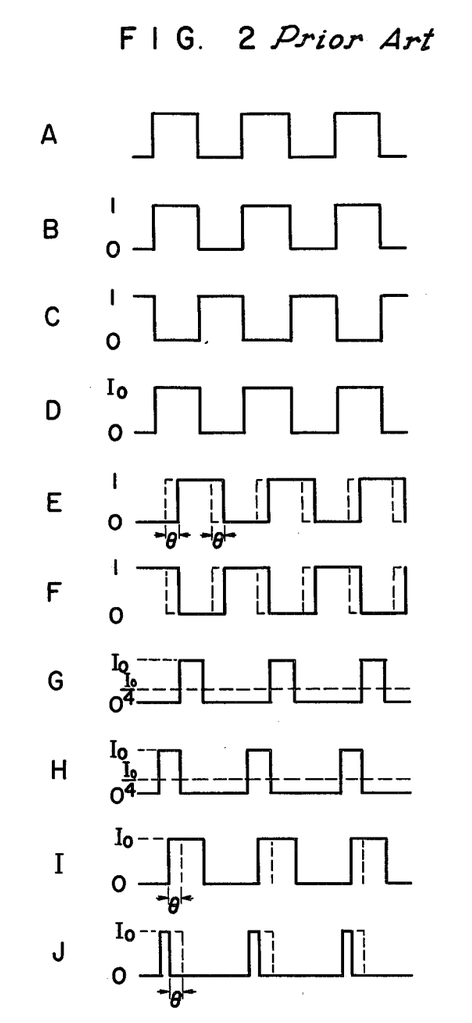
FIG. 2 is a signal waveform diagram illustrating the demodulating operation of the demodulating circuit shown in FIG. 1.

Suppose that this FM signal input of intermediate frequency has a waveform as shown in (A) of FIG. 2. Then, the transistors 411 and 412 in the first switching circuit 41 perform a switching operation with waveforms as shown in (B) and (C) of FIG. 2, respectively. Also, the transistors 431 and 432 in the second switching circuit 43 perform a switching operation with waveforms as shown by the solid lines in (E) and (F) of FIG. 2, respectively. As a result of the switching operation of these transistors, a current having a waveform as shown in (D) of FIG. 2 flows through the collector of transistor 411 in the first switching circuit 41. The flowing angle of this collector current corresponds to one-half the period of the FM signal input of intermediate frequency, and the mean current value is $I_o/2$, where $I_o$ is a constant current supplied from a regulated current supply source 46. Currents having waveforms as shown in (G) and (H) of FIG. 2 flow through the collectors of the transistors 431 and 432 respectively in the second switching circuit 43. The flowing angle of these collector currents corresponds to the quarter of the period of the FM signal input of intermediate frequency, and the mean current value thereof is $I_o/4$. The above description refers to the case in which the frequency of the FM signal input matches with the tuning frequency of a tuning circuit 422 in the phase shifting circuit 42.

When the frequency of the FM signal input deviates by $\Delta f$ from the tuning frequency of the tuning circuit 422, the second switching circuit 43 is switched by a signal whose phase is shifted by $\theta$ according to the frequency deviation $\Delta f$ v.s. phase deviation $\theta$ characteristic of the tuning circuit 422. As a result, the transistors 431 and 432 in the second switching circuit 43 perform a switching operation with waveforms as shown by the dotted lines in (E) and (F) of FIG. 2, respectively. The flowing angles of the collector currents of these transistors 431 and 432 are shown in (I) and (J) of FIG. 2, respectively, in which it will be seen that the former is more than the quarter period by $\theta$, and the latter is less than the quarter period by $\theta$. Therefore, their mean current value varies in proportion to $\theta$ on opposite sides of $I_o/4$ which is the center. Such signals are passed through an amplifier 6 and a low-pass filter 7 to derive a demodulated FM signal from an output terminal 8.

As is commonly known, noise is applied to the FM input terminal 1 in addition to the FM signal. A noise component in this noise passes through the filter 2, and after being amplified by the amplifier 3, it is applied to the first switching circuit 41 in the demodulating circuit 4. Another noise component generated in the amplifier 3 is also applied to the first switching circuit 41. These noise components appear at the output terminal 8 together with the demodulated FM signal.

The noise output appearing at the output terminal 8 does not provide any practical problem when the level of the FM signal input applied to the input terminal 1 is higher than that of the noise input. This is because, in such a case, the level of the noise output appearing at the output terminal 8 is reduced in proportion to the level of the FM signal input, that is, in other words, the level of the demodulated FM signal output appearing at the output terminal 8 is much higher than that of the noise output. When, however, the level of the FM signal input applied to the input terminal 1 is lower than that of the noise input, the level of the noise output makes a sharp increase with the lowering of the level of the FM signal input, that is, in other words, the level of the noise output appearing at the output terminal 8 becomes much higher than that of the demodulated FM signal output, contrary to the former case. In this latter case, the noise output provides a practical problem which leads to an undesirable deterioration of the S/N ratio of the demodulating circuit 4. The noise level in such a case is generally referred to as a critical level for noise improvement.

A noise output giving rise to a problem as above pointed out appears also in the absence of an FM input signal at the input terminal 1, as in the case in which the FM signal input level applied to the input terminal 1 is lower than the noise input level.

It is therefore desirable to mute this undesirable noise output as much as possible.

According to a prior art attempt, the pass band of the low-pass filter 7 disposed in the output stage of the demodulating circuit 4 is narrowed in order to mute the noise appearing at the demodulated FM signal output terminal 8. However, narrowing of the pass band of the low-pass filter 7 results in a correspondingly narrowed band of the demodulated FM signal, and the distortion factor is deteriorated to provide another practical problem to be solved.

According to another prior art attempt, a band-pass filter is interposed between the demodulating circuit and its pre-amplifier so as to mute the noise applied to the demodulating circuit. However, when the demodulating circuit and its pre-amplifier are designed to be incorporated in the same integrated circuit, the newly added band-pass filter must be disposed external to the integrated circuit, and additional connecting pins must be provided for electrically connecting the band-pass filter to the integrated circuit. Such an increase in the number of external parts, hence the number of connecting pins in the integrated circuit is undesirable from the viewpoint of fabrication.

A prior art practice employed to solve the above problem is such that a switch 9 is interposed between the output of the filter 7 and the output terminal 8 as shown in FIG. 1. Further, a rectifying circuit 10 and a selective signal transmission circuit such as a Schmitt circuit 11 are interposed between the output of the amplifier 3 and the switch 9 as shown in FIG. 1. The rectifying circuit 10 detects the FM signal output of the amplifier 3 and rectifies the detected signal. The Schmitt circuit 11 acts to turn on the switch 9 to permit transmission of the FM signal output of the filter 7 to the output terminal 8 when the output signal of the rectifying circuit 10 exceeds a predetermined level, that is, when the FM signal input to the input terminal 1 has a level higher than the critical level for noise improvement.

In the other cases, that is, when the FM signal input to the input terminal 1 has a level lower than the critical level for noise improvement and when no FM signal input is applied to the input terminal 1, the Schmitt circuit 11 acts to maintain the switch 9 in the off state to prohibit the FM signal output of the filter 7 from being transmitted to the output terminal 8, thereby eliminating appearance of noise at the output terminal 8 together with the demodulated FM signal in such cases.

However, this prior art practice is defective in that not only the number of required elements is increased, but also the demodulated FM signal is not obtained when the FM signal input to the input terminal 1 has such a signal level which is lower than that required for triggering the Schmitt circuit 11 but higher than the critical level for noise improvement.

SUMMARY OF THE INVENTION

It is an object of the present invention to provide a noise muting circuit for use in a demodulating circuit of an FM receiver for muting noise appearing in the absence of any FM signal input to be demodulated.

Another object of the present invention is to provide a noise muting circuit of the kind above described which can mute noise appearing during demodulation of an FM signal input of low level to be demodulated and which permits sufficient demodulation of even an FM signal input of such a low level which exceeds slightly the critical level for noise improvement.

Still another object of the present invention is to provide a noise muting circuit of the kind above described which is suitable for integration into an integrated circuit form together with other circuits.

The present invention attaining the above objects comprises a noise muting circuit which is disposed in a stage preceding a switching circuit in a phase multiplier type FM demodulating circuit so that, when an FM signal input has a level lower than the critical level for noise improvement, such an FM signal input and noise are prohibited from being applied to the switching circuit, while when the FM signal input has a level higher than the critical level for noise improvement, the FM signal input portion exceeding the critical level is permitted to be applied to the switching circuit together with an input noise portion.

According to the present invention, the noise muting circuit acts to mute noise appearing in the absence of any FM signal input to be demodulated or when an FM signal input to be demodulated is of quite low level, thereby reducing the amount of noise input applied to the demodulating circuit. Therefore, the amount of noise demodulated in the demodulating circuit can be reduced. According to the present invention, further, an FM signal input is permitted to be applied to the demodulating circuit only when the level of the FM signal input is higher than the critical level for noise improvement. Therefore, an FM signal input of level lower than the prior art limit can also be sufficiently demodulated provided that its level exceeds the critical level for noise improvement.

DESCRIPTION OF THE PREFERRED EMBODIMENT

Preferred embodiments of the present invention will now be described in detail with reference to the drawing.

Figure 3:
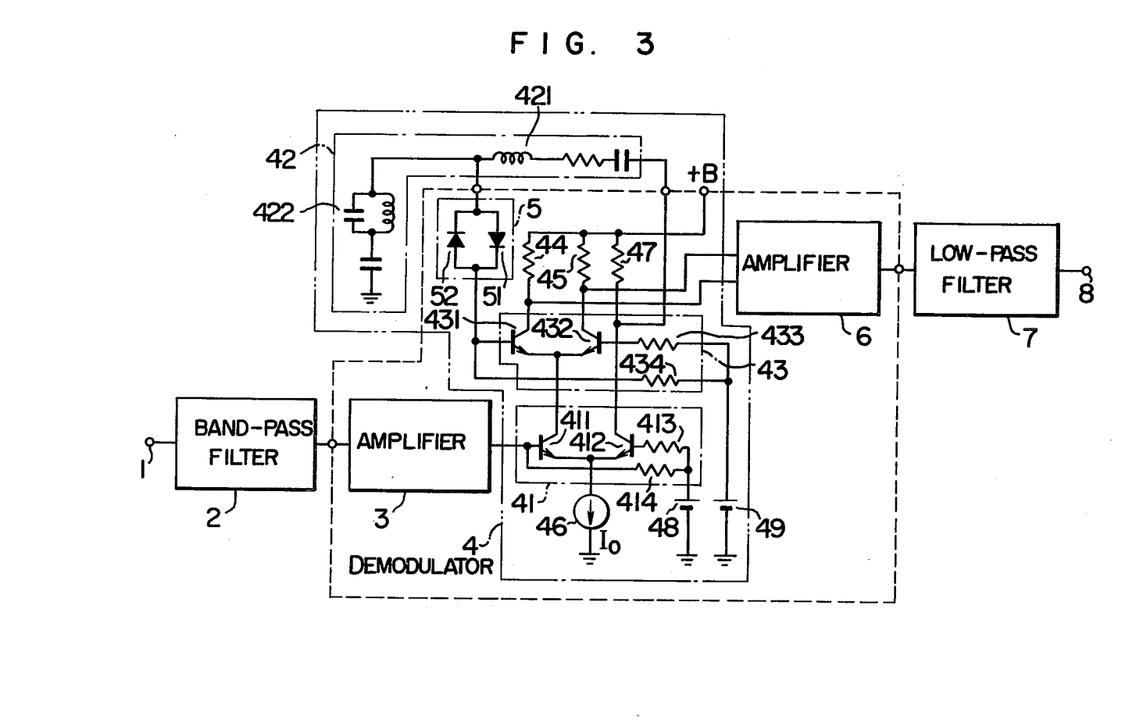
FIG. 3 is a connection diagram of an embodiment of the present invention.

FIG. 3 is a connection diagram of an embodiment of the present invention. Referring to FIG. 3, an FM signal of intermediate frequency is applied to an input terminal 1 and passes through a band-pass filter 2 to be applied to an amplifier 3 such as a differential amplifier. The differential amplifier 3 amplifies the FM signal of intermediate frequency applied from the filter 2 and has also the function of limiting the amplitude of the signal. A phase multipler type demodulating circuit 4 demodulates the output signal of the amplifier 3. The demodulating circuit 4 comprises a first switching circuit 41, a phase shifting circuit 42 and a second switching circuit 43. The first switching circuit 41 includes a differentially operating transistor pair 411 and 412 making switching operation with the FM signal of intermediate frequency applied from the amplifier 3, and a pair of base resistors 413 and 414 are provided for these transistors 411 and 412. The phase shifting circuit 42 includes a phase shifting element such as a phase shifting coil 421 and a tuning circuit 422 for shifting the phase of the FM signal input of intermediate frequency by about $\pi/2$ (90°). The second switching circuit 43 includes a differentially operating transistor pair 431 and 432 connected in series with the transistor 411 in the first switching circuit 41 for making switching operation with the phase-shifted FM signal applied from the phase shifting circuit 42, and a pair of base resistors 433 and 434 are provided for these transistors 431 and 432. The first and second switching circuits 41 and 43 operate as differential amplifiers when the inputs thereto are of low level. When the first and second switching circuits 41 and 43 operate as differential amplifiers, the inputs to the first and second switching circuits 41 and 43 proportional to the FM signal input are multiplied to appear as a demodulated output signal.

A noise muting circuit 5 is connected across the base of transistor 431 and the connection point of the phase shifting coil 421 and the tuning circuit 422. This noise muting circuit 5 can be integrated as a part of an integrated circuit together with other circuits and may consist of a pair of diodes 51 and 52 connected in inverse-parallel with each other. The function of this noise muting circuit 5 is such that a portion of the output signal of the phase shifting circuit 42 is permitted to be applied to the second switching circuit 43 only when the amplitude of the output signal of the phase shifting circuit 42 exceeds the threshold voltage level $V_R$ of the diodes 51 and 52. An amplifier 6 amplifies in differential fashion the signals appearing across load resistors 44 and 45 connected respectively to the collectors of transistors 431 and 432 in the second switching circuit 43. However, this amplifier 6 may act to amplify solely one of the signals appearing across the load resistors 44 and 45. A low-pass filter 7 is connected between the amplifier 6 and a demodulated FM signal output terminal 8 to permit application of low-frequency components of the output of the amplifier 6 to the output terminal 8.

In FIG. 3, the portions surrounded by the dotted lines are integrated into an integrated circuit form. The elements including the amplifiers 3 and 6 are included in the integrated circuit in addition to the demodulating circuit 4 for the purposes of decreasing the number of circuit parts and stabilizing the operating performance.

The operation of the circuits shown in FIG. 3 will be described with reference to the case in which no FM signal input to be demodulated is applied to the input terminal 1. In such a case, noise appearing at the input terminal 1 and passed through the filter 2 as well as noise generated in the amplifier 3 is applied to the first switching circuit 41 in the demodulating circuit 4. The noise input to the first switching circuit 41 is applied through the transistor 412 to the phase shifting circuit 42.

Suppose that the noise muting circuit 5 according to the present invention is not present in FIG. 3. Then, in response to the application of the noise input to the phase shifting circuit 42, noise having frequency components in the vicinity of the center frequency of the tuning circuit 422 is selected by the selectivity of the tuning circuit 42, and such noise is solely applied to the second switching circuit 43. In this case, therefore, the noise input to the first switching circuit 41 is switched or amplified by the transistor 411 in the first switching circuit 41 and is applied to the load resistors 44 and 45 together with in-hand noise applied to the second switching circuit 43 from the phase shifting circuit 42 and switched or amplified by the transistors 431 and 432 in the second switching circuit 43. In addition to these noise signals, a noise signal of beat frequency produced as a result of mixing of the above noise signals appears also on the load resistors 44 and 45. These noise signals are applied through the amplifier 6 to the filter 7, and the noise components passed through the filter 7 appear at the output terminal 8. This noise output is quite large and is offensive to the ear.

Referring to FIG. 3 again, the noise muting circuit 5 is interposed between the second switching circuit 43 and the phase shifting circuit 42. By virtue of the provision of this noise muting circuit 5, a noise output of the phase shifting circuit 42 having a level lower than the threshold voltage level $V_R$ of the diodes 51 and 52 is prohibited from being applied to the second switching circuit 43. In this case, therefore, in-hand noise applied from the phase shifting circuit 42 and noise of beat frequency produced due to mixing of the in-hand noise with noise applied to the first switching circuit 41 do not appear on the load resistors 44 and 45, although the noise input to the first switching circuit 41 appears on the load resistors 44 and 45. Thus, the resultant noise can be muted by that amount.

Description will next be directed to the case in which an FM signal of intermediate frequency is applied to the input terminal 1. The FM signal of intermediate frequency applied to the input terminal 1 passes through the filter 2 and amplifier 3 to be applied to the demodulating circuit 4. The diodes 51 and 52 constituting the noise muting circuit 5 are set to be turned on when the level of the FM signal input exceeds the critical level for noise improvement and the composite amplitude of noise and the FM signal input exceeds the threshold voltage level $V_R$ of the diodes 51 and 52. This is because a demodulator cannot carry out its primary function due to the appearance of large demodulation noise when the level of an FM signal input thereto is lower than the critical level for noise improvement. In other words, a bad result giving rise to an undesirable increase in the demodulation noise is brought forth when the diodes 51 and 52 are set to be turned on at an FM signal input level lower than the critical level for noise improvement.

Thus, when the level of the FM signal input applied to the input terminal 1 is lower than the critical level for noise improvement and the composite amplitude of the FM signal input and noise input does not exceed the threshold voltage level $V_R$ of the diodes 51 and 52 constituting the noise muting circuit 5, the FM signal input and noise input are blocked by the noise muting circuit 5 and are not applied to the second switching circuit 43 in the demodulating circuit 4, even when such inputs are applied to the first switching circuit 41. Therefore, the operation is similar to that described with reference to the absence of the FM signal input, and the undesirable demodulation noise is muted.

On the other hand, when the level of the FM signal input is higher than the critical level for noise improvement and the composite amplitude of the FM signal input and noise input exceeds the threshold voltage level $V_R$ of the diodes 51 and 52 constituting the noise muting circuit 5, the FM signal input and noise input applied to the first switching circuit 41 in the demodulating circuit 4 are further applied to the second switching circuit 43 through the diodes 51 and 52 to be demodulated by the demodulating circuit 4. In this case, the noise thus demodulated is muted in proportion to the FM signal input level and does not provide any practical problem due to the fact that the FM signal input is higher than the critical level for noise improvement.

Figures 4, 6A, 6B, 6C:
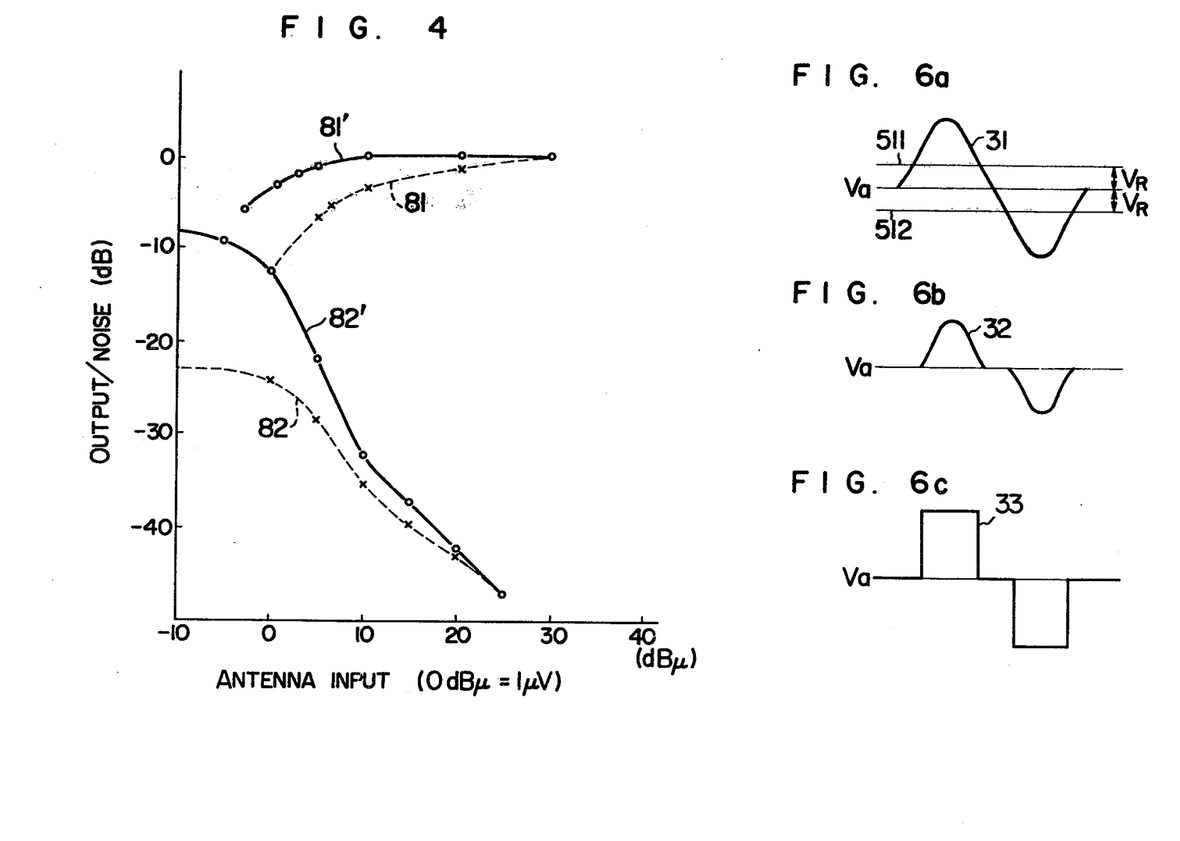
FIG. 4 is a graph showing the signal output level and the noise output level relative to the antenna input level in the embodiment shown in FIG. 3.

FIG. 4 is a graph showing the signal output level and the noise output level relative to the antenna input level in the FM receiver provided with the phase multiplier type FM demodulating circuit shown in FIG. 3 to exhibit the excellency of the present invention over the FM receiver provided with the demodulating circuit shown in FIG. 1. In FIG. 4, the characteristic curves 81 and 82 represent the signal output level and noise output level respectively in the FM receiver according to the present invention, while the characteristic curves 81' and 82' shown for the purpose of comparison represent the signal output level and noise output level respectively in the prior art FM receiver which is not provided with the noise muting circuit 5 in its demodulating circuit 4. It will be seen from FIG. 4 that the noise output in the very low antenna input range can be reduced to a level lower than the prior art level by about 15 dB, according to the present invention. The signal output level in the case of the present invention is slightly decreased as compared with the prior art level. This is because the switching input level for switching the second switching circuit 43 in the demodulating circuit 4 is lowered due to the provision of the noise muting circuit 5. However, such a decrease in the switching input level can be easily remedied. For example, an amplifier may be connected to the output of the noise muting circuit 5 for compensating the decrease in the switching input level, or the settings of the load resistors 44 and 45 may be increased for the purpose of level compensation.

Figure 5:
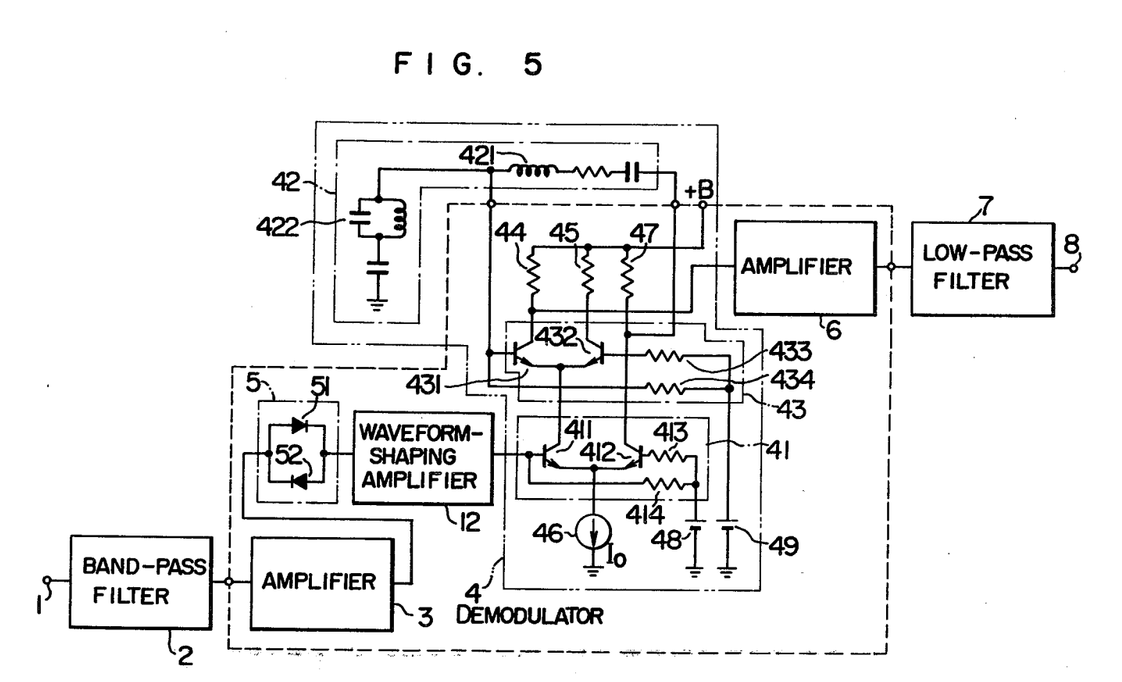
FIG. 5 is a connection diagram of another embodiment of the present invention.

FIG. 5 shows another embodiment of the present invention, and actually, this second embodiment is a modification of the first embodiment shown in FIG. 3. In FIG. 5, the noise muting circuit 5 is interposed between the amplifier 3 and the demodulating circuit 4, and a signal waveform shaping amplifier 12 is connected between the noise muting circuit 5 and the demodulating circuit 4 for ensuring complete switching of the first and second switching circuits 41 and 43 in the demodulating circuit 4. Inasmuch as FIG. 5 is a modification of FIG. 3, the same reference numerals are used to designate the same parts, and description of such parts is unnecessary.

The operation of the circuit shown in FIG. 5 will be described with reference to the case in which no FM signal input to be demodulated is applied to the input terminal 1. In such a case, noise appearing at the input terminal 1 as well as noise generated in the amplifier 3 is applied to the noise muting circuit 5. These noise inputs are blocked by the noise muting circuit 5 when the gain of the amplifier 3 is selected so that the amplitude of these noise inputs may not exceed the threshold voltage level $V_R$ of the diodes 51 and 52 constituting the noise muting circuit 5. In this case, therefore, noise generated in the amplifier 12 provides the sole input to the demodulating circuit 4. However, this amplifier 12 is a low-gain amplifier and any substantial noise is not generated in itself, since the primary function of this amplifier 12 is to compensate for lowering of the signal output level of the amplifier 3 due to the presence of the noise muting circuit 5 and to shape the waveform of the output signal of the amplifier 3. Therefore, noise of small amount is applied to the demodulating circuit 4, and the amount of noise demodulated by the demodulating circuit 4 is also very small.

An FM signal of intermediate frequency applied to the input terminal 1 is passed through the filter 2 and amplified by the amplifier 3 to be applied to the noise muting circuit 5. At this time, noise generated in the amplifier 3 is also applied to the noise muting circuit 5. As in the first embodiment shown in FIG. 3, the diodes 51 and 52 constituting the noise-muting circuit 5 are set to be turned on when the level of the FM signal input is higher than the critical level for noise improvement and the composite amplitude of the FM signal input and noise input exceeds the threshold voltage level $V_R$ of the diodes 51 and 52. At this time, the output signal of the amplifier 3 has a waveform as, for example, shown by the curve 31 in FIG. 6a. Thus, when the amplitude of the output signal of the amplifier 3 exceeds the lines 511 and 512 representing the threshold voltage level $V_R$ of the diodes 51 and 52, the signal portion exceeding these lines 511 and 512 passes through the diodes 51 and 52. The signal portion passed through the diodes 51 and 52 has a waveform as shown by the curve 32 in FIG. 3b, and its amplitude is decreased by the amount corresponding to the threshold voltage level $V_R$ of the diodes 51 and 52. This means that the level of the output signal of the amplifier 3 is decreased as it passes through the noise muting circuit 5. This decrease in the level can be compensated by the amplifier 12 as described hereinbefore. The amplifier 12 is not especially required if the removal or muting of noise appearing in the absence of any FM signal input is merely desired. In FIG. 6, Va represents the dc output voltage of the amplifier 3, hence the dc input voltage applied to the amplifier 12. The signal subjected to waveform shaping in the amplifier 12 has a waveform as shown by 33 in FIG. 6c, and this signal is applied from the amplifier 12 to the demodulating circuit 4 to be demodulated thereby. Noise is included in the thus demodulated signal. However, the level of the demodulated noise decreases in proportion to the level of the FM signal input to an extent which does not provide any practical problem, due to the fact that the level of the FM signal input is higher than the critical level for noise improvement in this case.

I claim:
1. In an FM receiver comprising:
    (a) an input terminal receiving an FM signal of intermediate frequency;
    (b) an amplifier connected to said input terminal for amplifying the FM signal of intermediate frequency applied to said input terminal; and
    (c) a phase multiplier type FM demodulator circuit connected to said amplifier for demodulating an FM signal output of said amplifier and including:
    first switching means connected to said amplifier and having a differentially operating transistor pair performing a switching operation in response to the FM signal output of said amplifier;
    phase shifting means for shifting a phase of an FM signal output of said first switching means;
    second switching means having a differentially operating transistor pair connected in series with one transistor of the transistor pair of said first switching means and connected to said phase shifting means, for performing a switching operation in response to a phase-shifted FM signal output of said phase shifting means; and
    first circuit means connected to said second switching means, for extracting audio signal components from a signal output of said second switching means;
    the improvement comprising a noise muting circuit connected between the other transistor of said first switching means and an input of said phase shifting means, for blocking transmission of the signal output of said amplifier and noise to said phase shifting means when no FM input signal is applied to said input terminal and also when a level of the FM input signal applied to said input terminal is lower than that of a noise input applied to said input terminal, said noise input level in such a case being a critical level for noise improvement and permitting transmission of an FM signal portion and a noise portion exceeding the critical level for noise improvement to said phase shifting means when the level of said FM input signal applied to said input terminal is higher than that of said noise input applied to said input terminal and exceeds the critical level for noise improvement.

2. In an FM receiver as claimed in claim 1, wherein said noise muting circuit comprises a pair of diodes connected in inverse-parallel with each other, said diodes having one end connected to said first switching means and the other end connected to said phase shifting means.

3. In an FM receiver comprising:
(a) an input terminal receiving an FM signal of intermediate frequency;
(b) an amplifier connected to said input terminal for amplifying the FM signal of intermediate frequency applied to said input terminal; and
(c) a phase multiplier type FM demodulator circuit connected to said amplifier for demodulating an FM signal output of said amplifier and including:
first switching means connected to said amplifier and having a differentially operating transistor pair performing a switching operation in response to the FM signal output of said amplifier;
phase shifting means connected to one transistor of the transistor pair of said first switching means, for shifting a phase of the FM signal output;
second switching means having a differentially operating transistor pair connected in series with the other transistor of said first switching means, for performing a switching operation in response to a phase-shifted FM signal output of said phase shifting means; and
first circuit means connected to said second switching means, for extracting audio signal components from a signal output of said second switching means;
the improvement comprising a noise muting circuit, connected between an output of said phase shifting means and an input of said second switching means in said demodulator circuit, for blocking transmission of the signal output of said amplifier and noise to said second switching means when no FM signal input is applied to said input terminal and also when a level of the FM signal input applied to said input terminal is lower than that of a noise input applied to said input terminal, said noise level in such a case being a critical level for noise improvement, and permitting transmission of an FM signal portion and a noise portion exceeding a critical level for noise improvement to said second switching means when the level of the FM signal input applied to said input terminal is higher than that of the noise input applied to said input terminal and exceeds the critical level for noise improvement.

4. In an FM receiver as claimed in claim 3, wherein said noise muting circuit comprises a pair of diodes connected in inverse-parallel with each other, said diodes having one end connected to an output of said phase shifting means and the other end connected to an input of said second switching means.

5. In an FM receiver comprising:
(a) an input terminal receiving an FM signal of intermediate frequency;
(b) an amplifier for amplifying the FM signal of intermediate frequency applied to said input terminal; and
(c) a phase multiplier type FM demodulator circuit connected to said amplifier for demodulating an FM signal output of said amplifier and including:
first switching means having a differentially operating transistor pair performing a switching operation in response to the FM signal output of said amplifier;
phase shifting means connected to one transistor of the transistor pair of said first switching means, for shifting a phase of the FM signal output;
second switching means connected to said phase shifting means and having a differentially operating transistor pair connected in series with the other transistor of said first switching means, for performing a switching operation in response to a phase-shifted FM signal output of said phase shifting means; and
first circuit means connected to said second switching means, for extracting audio signal components from a signal output of said second switching means;
the improvement comprising: a noise muting circuit connected between said amplifier and said demodulator circuit, for blocking transmission of the signal output of said amplifier and noise to said demodulator circuit when no FM signal input is applied to said input terminal and also when a level of the FM signal input applied to said input terminal is lower than that of a noise input applied to said input terminal, said noise level in such a case being a critical level for noise improvement, and permitting transmission of an FM signal portion and a noise portion exceeding said critical level for noise improvement to said demodulator circuit when the level of the FM signal input applied to said input terminal is higher than that of the noise input applied to said input terminal and exceeds the critical level for noise improvement; and amplifier means connected between an output of said muting circuit and an input of the first switching means of said demodulator circuit, for amplifying an FM signal passed through said noise muting circuit and shaping a signal waveform of said FM signal to ensure complete switching operation of said first switching means.

6. In an FM receiver as claimed in claim 5, wherein said noise muting circuit comprises a pair of diodes connected in inverse-parallel with each other, said diodes having one end connected to an output of said amplifier and the other end connected to said amplifier means.

7. In an FM receiver comprising:
(a) an input terminal receiving an FM signal of intermediate frequency;
(b) an amplifier for amplifying the FM signal of intermediate frequency applied to said input terminal; and
(c) a phase multiplier type FM demodulator circuit connected to said amplifier for demodulating an FM signal output of said amplifer and including:
first switching means having a differentially operating transistor pair performing a switching operation in response to the FM signal output of said amplifier;
phase shifting means connected to one transistor of the transistor pair of said first switching means, for shifting a phase of the FM signal output FM signal output;
second switching means connected to said phase shifting means and having a differentially operating transistor pair connected in series with the other transistor of said first switching means, for performing a switching operation in response to a phase-shifted FM signal output of said phase shifting means; and first circuit means connected to said second switching means, for extracting audio components from a signal output of said second switching means;

the improvement comprising a noise muting circuit connected between said amplifier and said demodulator circuit, for blocking transmission of the signal output of said amplifier and noise to said demodulator circuit when no FM signal input is applied to said input terminal and also when a level of the FM signal input applied to said input terminal is lower than that of a noise input applied to said input terminal, said noise level in such a case being a critical level for noise improvement, and permitting transmission of an FM signal portion and a noise portion exceeding said critical level for noise improvement to said demodulator circuit when the level of the FM signal input applied to said input terminal is higher than that of the noise input applied to said input terminal and exceeds the critical level for noise improvement.

8. In an FM receiver comprising:
(a) input means for supplying an FM signal of intermediate frequency;
(b) a phase multiplier type FM demodulator circuit connected to said input means for demodulating said FM signal and including:

first switching means having a first and a second transistor and a constant current source and connected in such a manner that emitters of said first and second transistors are connected in common to said constant current source and that a base of one of said first and second transistors is connected to said input means so that the first switching means performs a differential operation;

phase shifting means having input and output terminals for shifting a phase of a signal supplied to the input terminal during transmission from the input to the output terminal, the input terminal being connected to a collector of the first transistor, so that an FM signal is supplied to the input terminal and thus a phase-shifted FM signal is outputted from the output terminal;

second switching means having a third and a fourth transistor and connected in such a manner that emitters of said third and fourth transistors are connected in common to a collector of the second transistor and that a base of one of said third and fourth transistors is connected to the output terminal of said phase shifting means, said second switching means performing a differential operation; and first circuit means connected to the collector of one of said third and fourth transistors, for extracting an audio signal from a signal output of said second switching means supplied thereto;

the improvement comprising a noise muting circuit inserted in series in a signal path formed from the input means to said second switching means through said first switching means and said phase shifting means, said noise muting circuit blocking transmission of a signal through said signal path when no FM signal input is outputted from said input means as well as when a level of the FM signal output from said input means is lower than a critical level for noise improvement, but permitting transmission of an FM signal portion and a noise portion exceeding the critical level for noise improvement in said signal path when the level of the FM signal obtained from said input means exceeds the critical level for noise improvement.

9. In an FM receiver as claimed in claim 8, wherein said noise muting circuit comprises a pair of diodes connected in inverse-parallel configuration with each other.

* * * * *